(12) United States Patent
Ball et al.

(10) Patent No.: US 9,936,618 B2
(45) Date of Patent: Apr. 3, 2018

(54) BOARD LEVEL SHIELDS INCLUDING FOIL AND/OR FILM COVERS

(71) Applicant: Laird Technologies, Inc., Earth City, MO (US)

(72) Inventors: Shelby Ball, Frisco, TX (US); Gerald R. English, Glen Ellyn, IL (US)

(73) Assignee: Laird Technologies, Inc., Earth City, MI (US)

( * ) Notice: Subject to any disclaimer, the term of this patent is extended or adjusted under 35 U.S.C. 154(b) by 0 days.

(21) Appl. No.: 15/357,001

(22) Filed: Nov. 21, 2016

(65) Prior Publication Data

US 2017/0171961 A1  Jun. 15, 2017

Related U.S. Application Data

(60) Provisional application No. 62/266,486, filed on Dec. 11, 2015, provisional application No. 62/291,421, filed on Feb. 4, 2016.

(51) Int. Cl.
*H05K 9/00* (2006.01)

(52) U.S. Cl.
CPC .................. *H05K 9/0032* (2013.01)

(58) Field of Classification Search
USPC .................................. 361/818, 816
See application file for complete search history.

(56) References Cited

U.S. PATENT DOCUMENTS 9,105,899 B2   8/2015 Pakula et al.
2005/0068758 A1*  3/2005 Blersch ............... H05K 9/0032
                                                  361/818

* cited by examiner

*Primary Examiner* — Andargie M Aychillhum
(74) *Attorney, Agent, or Firm* — Harness, Dickey & Pierce, P.L.C.

(57) ABSTRACT

According to various aspects, exemplary embodiments are disclosed of board level shields that include film and/or foil (e.g., electrically-conductive plastic film, metallized or metal plated film, metal foil, reinforced foil, poly-foil, etc.) covers or lids. Also disclosed are exemplary embodiments of methods relating to making EMI shielding apparatus or assemblies. Additionally, exemplary embodiments are disclosed of methods relating to providing shielding for one or more components on a substrate.

20 Claims, 12 Drawing Sheets

BOARD LEVEL SHIELDS INCLUDING FOIL AND/OR FILM COVERS

CROSS-REFERENCE TO RELATED APPLICATIONS

This application claims priority to and the benefit of U.S. Provisional Patent Application No. 62/266,486 filed Dec. 11, 2015 and U.S. Provisional Patent Application No. 62/291,421 filed Feb. 4, 2016. The entire disclosures of the above applications are incorporated herein by reference.

FIELD

The present disclosure generally relates to board level shields that include film and/or foil (e.g., electrically-conductive plastic film, metallized or metal plated film, metal foil, reinforced foil, poly-foil, etc.) covers or lids.

BACKGROUND

This section provides background information related to the present disclosure which is not necessarily prior art.

A common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and are not intended to limit the scope of the present disclosure.

Figure 6:
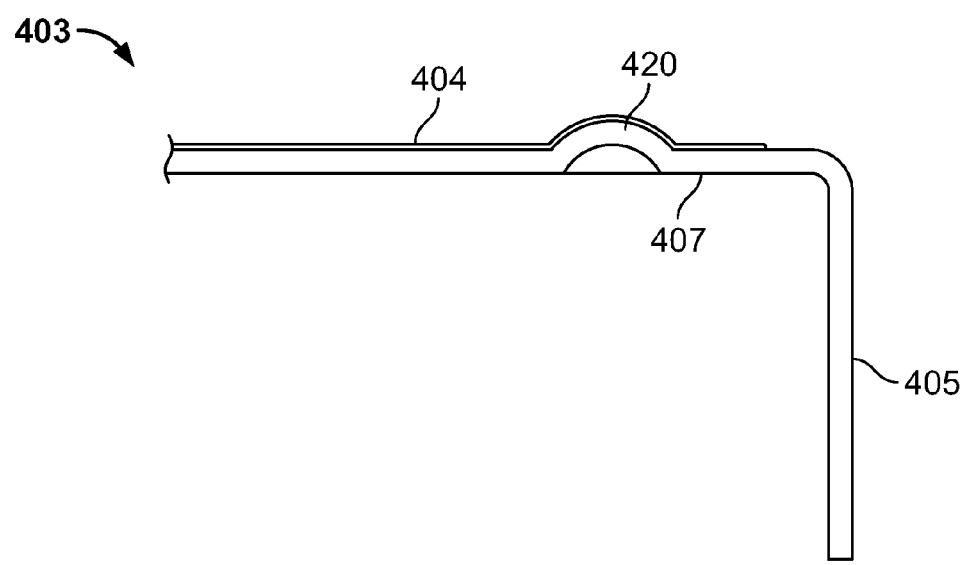
Figure 7:
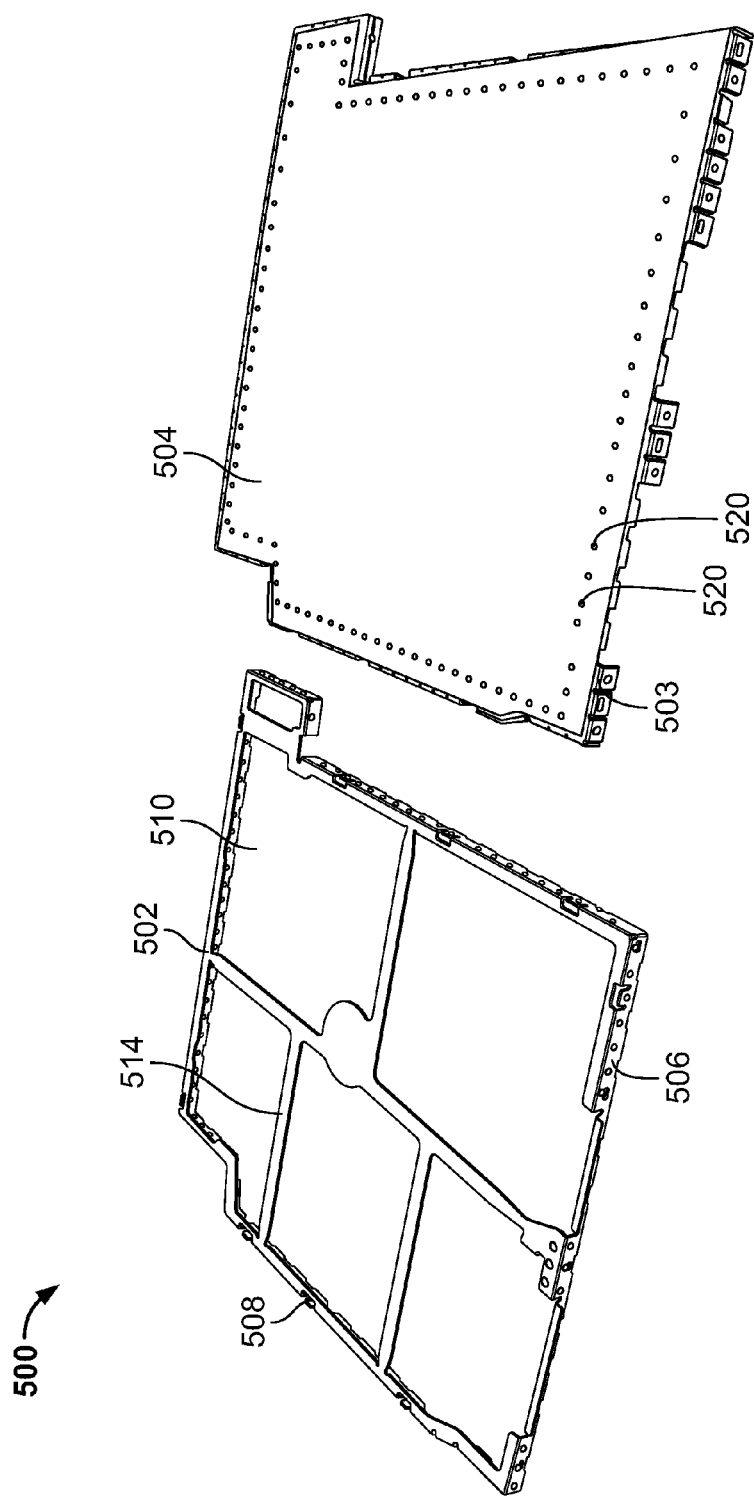
Figure 8:
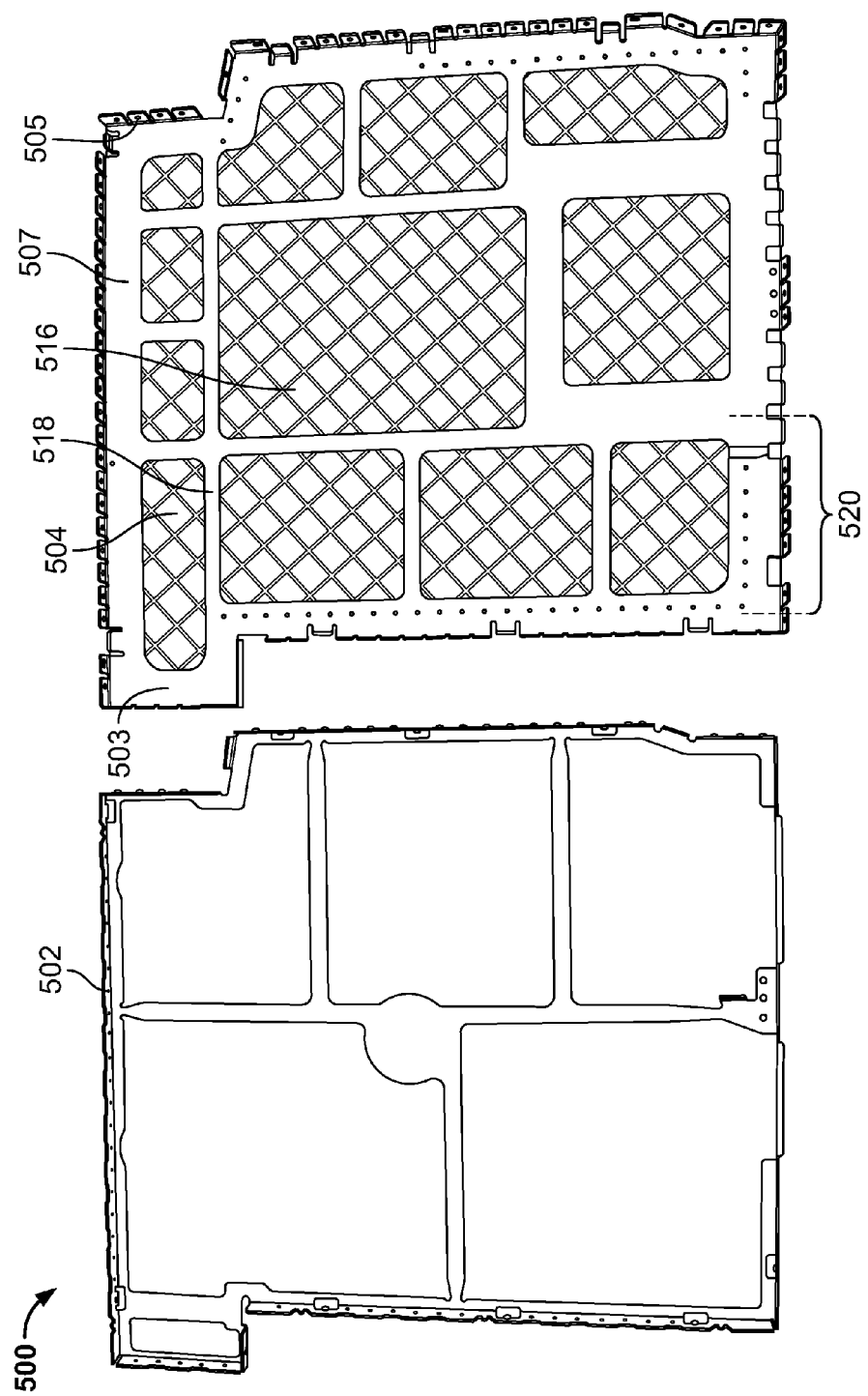
Figure 9:
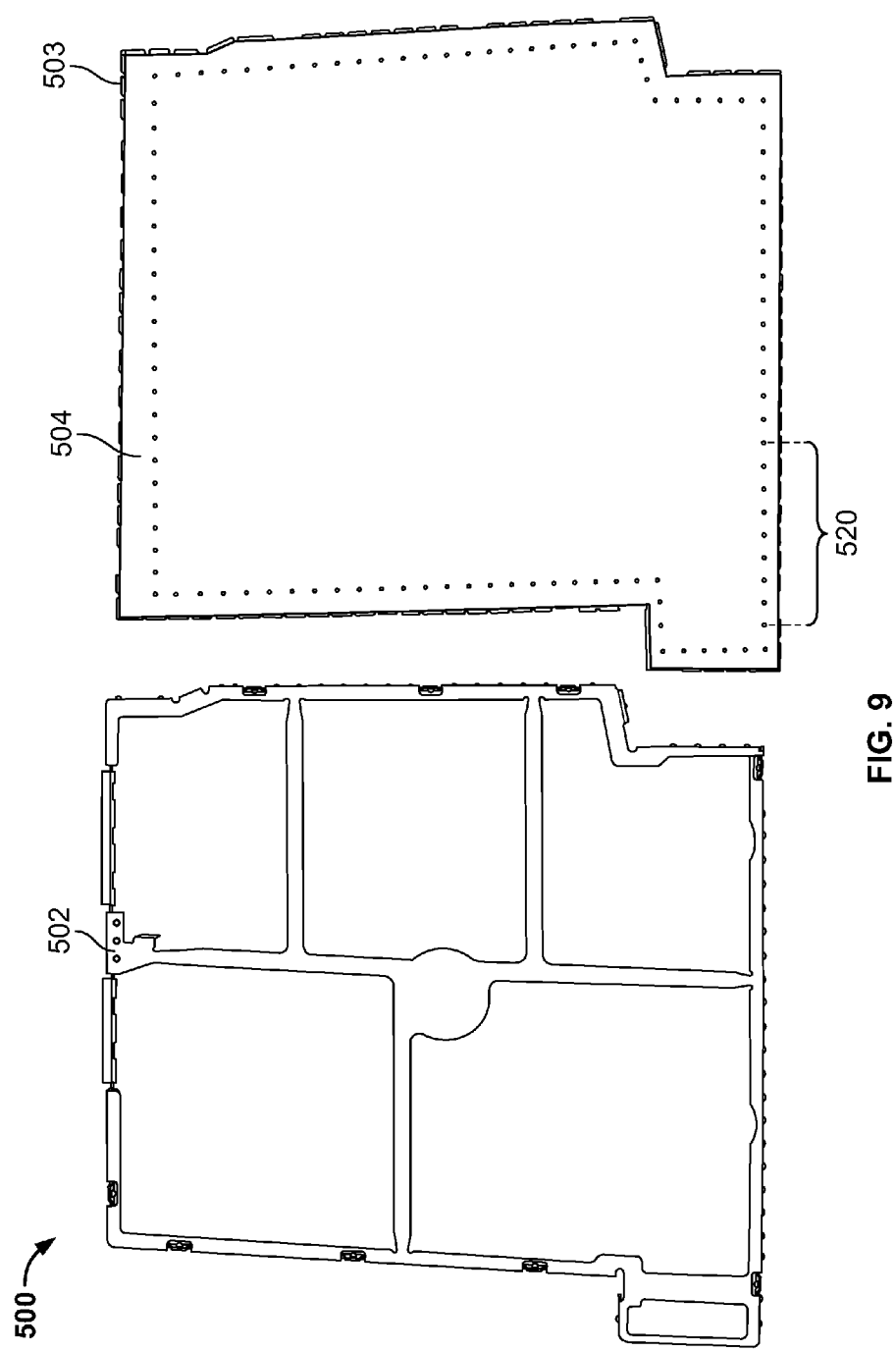
Figure 10:
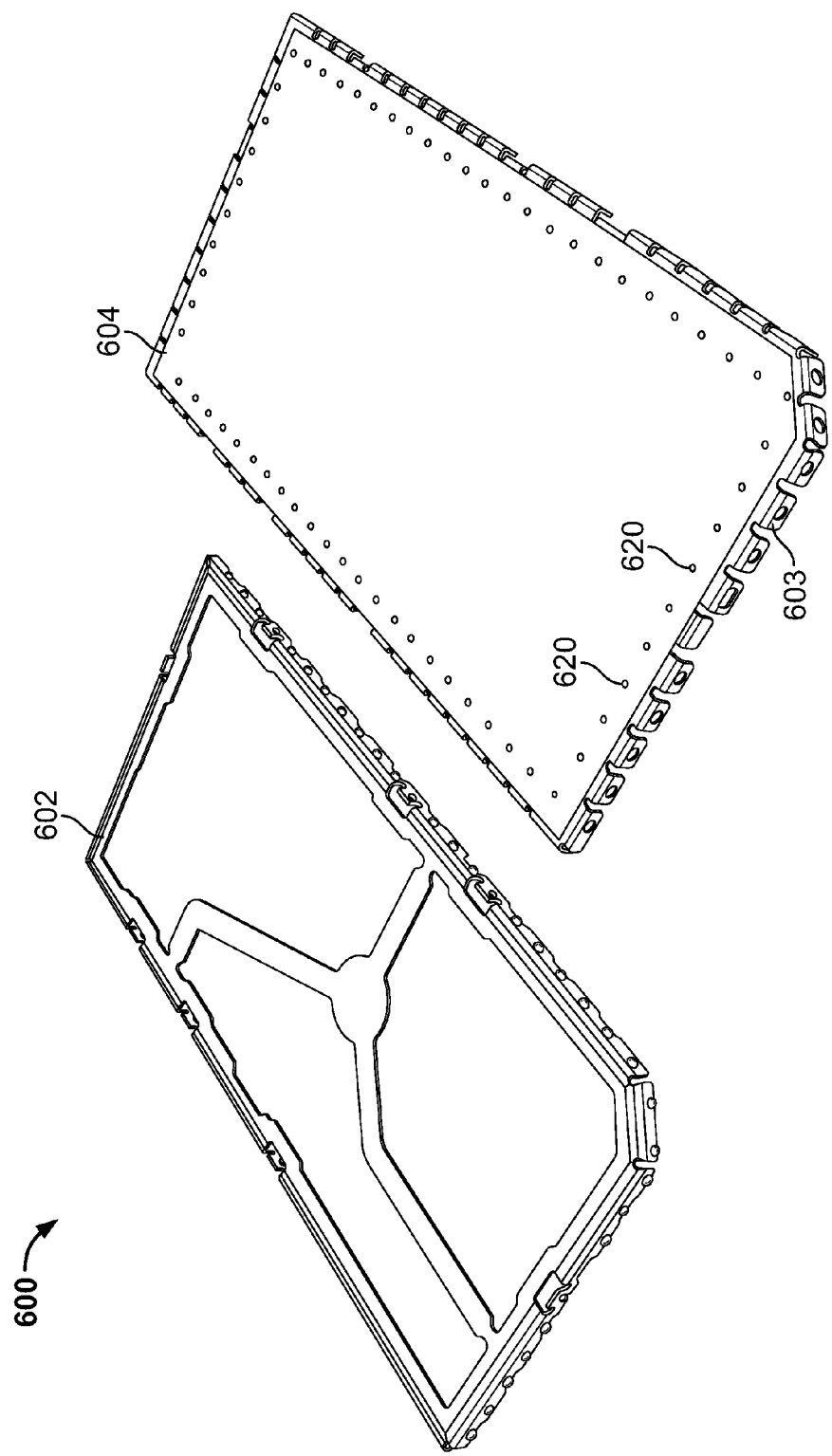
Figure 11:
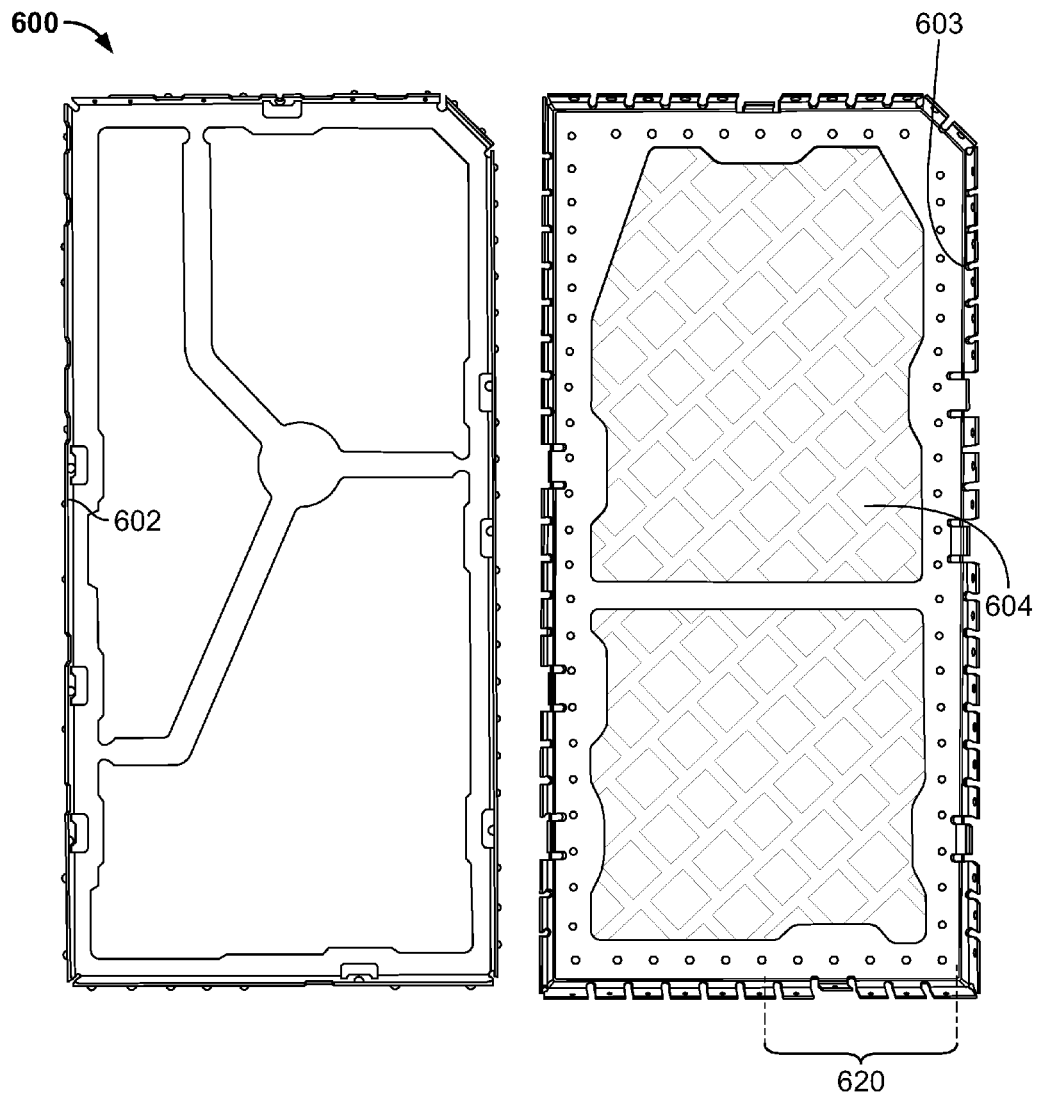
Figure 12:
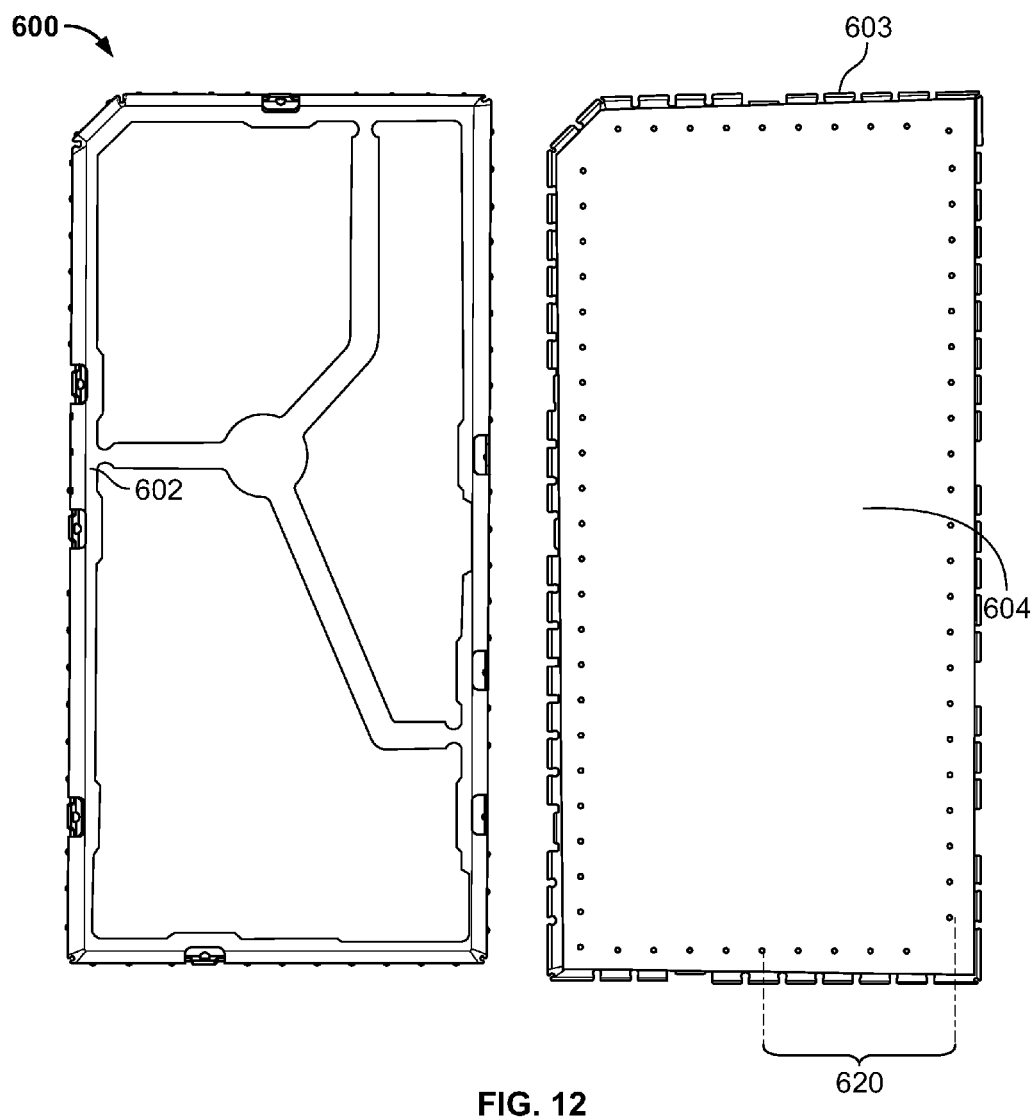
Figure 13:
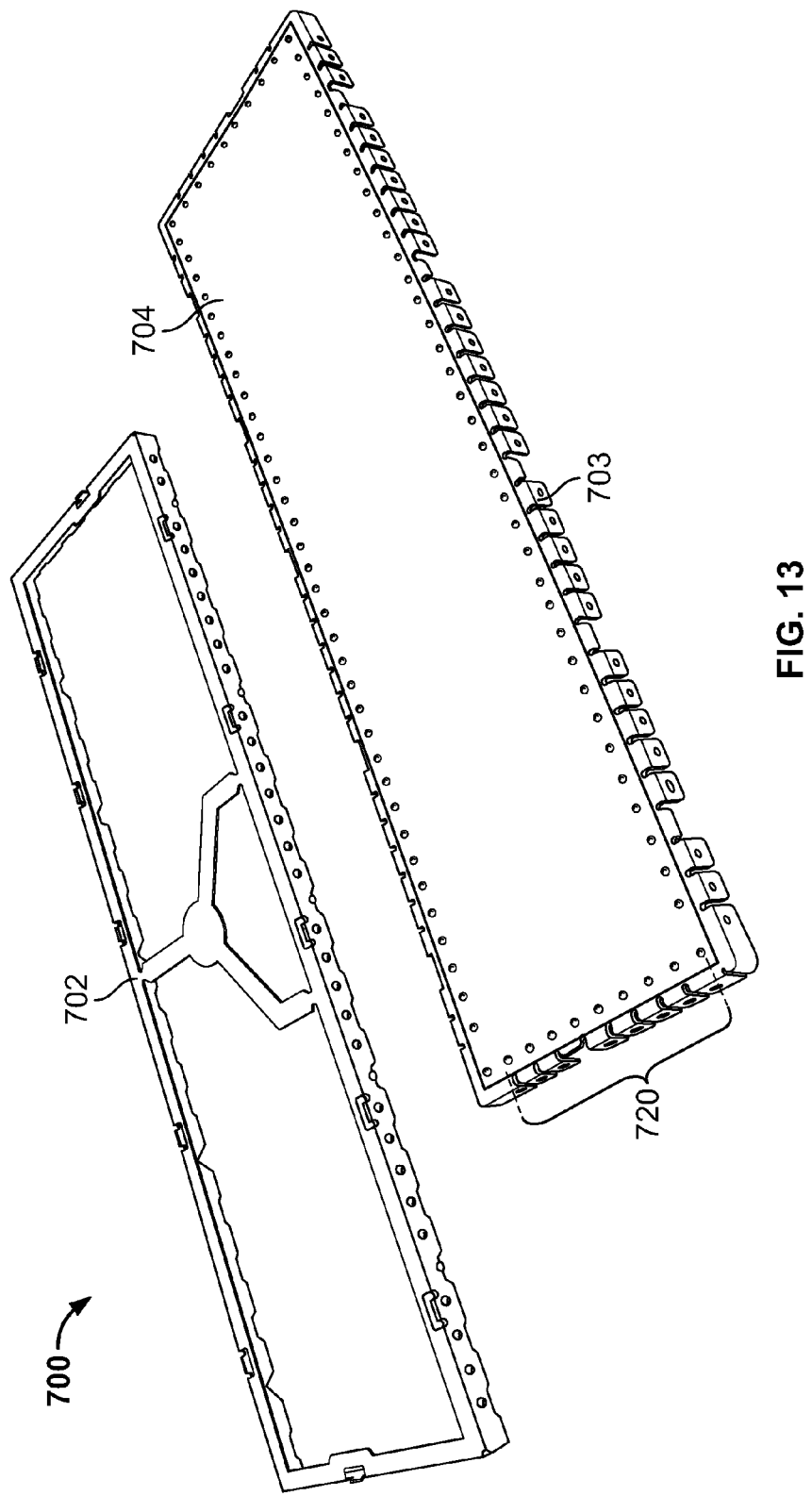
Figure 14:
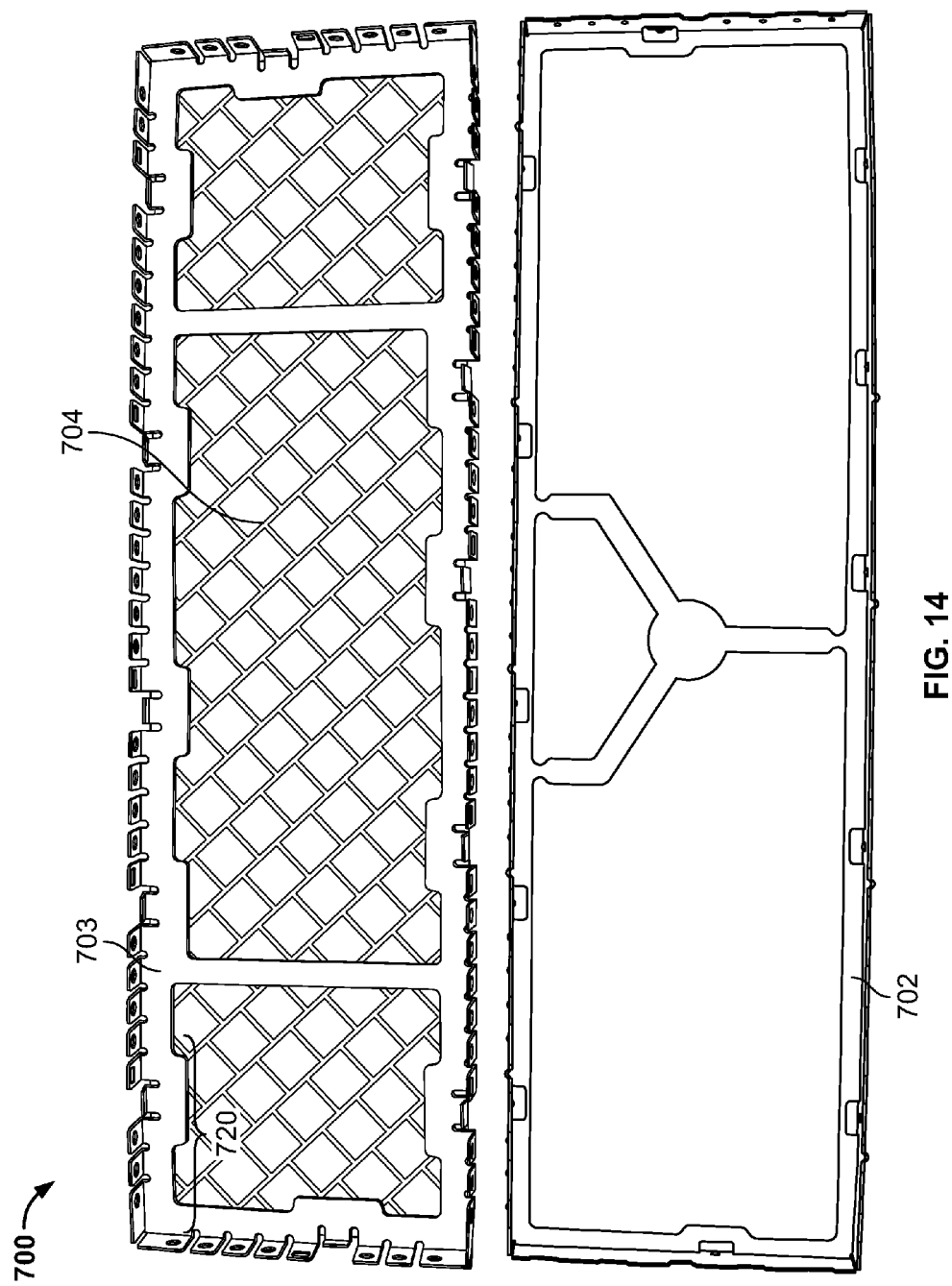
Figure 15:
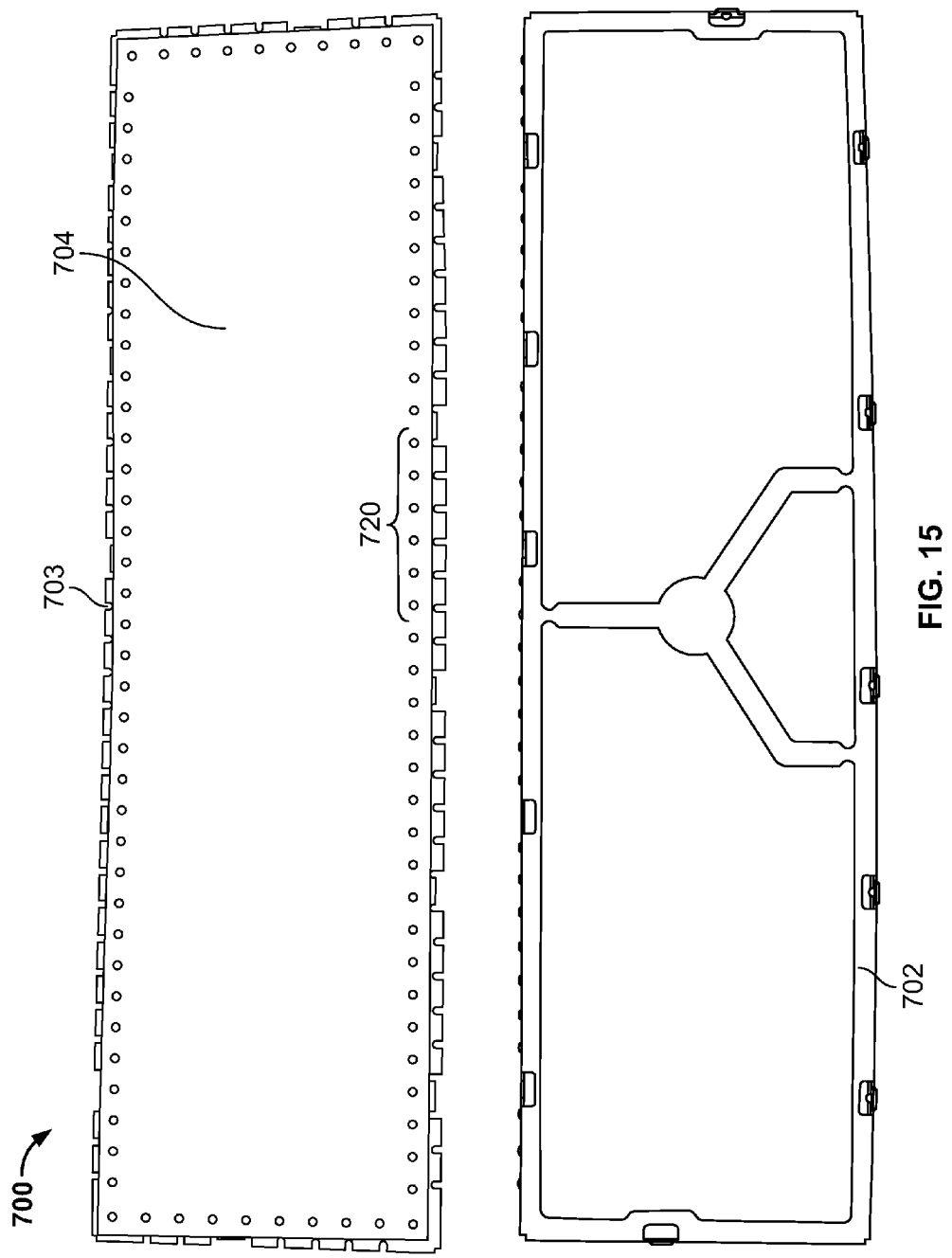

FIG. 6 is a cross-sectional side view of a portion of a BLS cover according to another exemplary embodiment in which foil or film is coupled to an upper or outer surface of the cover's inwardly extending perimeter flange, rim, or lip, and also illustrating a protrusion (e.g., a dimple, bump, piercing, etc.) formed in the cover's perimeter flange and the foil or film which protrusion may help improve electrical conductivity and adhesion strength between the cover's perimeter flange and the foil or film;

FIGS. 7 through 9 show a BLS including a frame or fence and a cover or lid according to another exemplary embodiment in which the cover includes poly-foil coupled to an upper or outer surface of the cover's inwardly extending perimeter flange, rim, or lip, and also illustrating a plurality of attachment features (e.g., dimples, piercings, protrusions, bumps, rivets, other mechanical features, etc.) which may help improve electrical conductivity and adhesion strength between the cover's perimeter flange and the poly-foil;

FIGS. 10 through 12 show a BLS including a frame or fence and a cover or lid according to another exemplary embodiment in which the cover includes poly-foil coupled to an upper or outer surface of the cover's inwardly extending perimeter flange, rim, or lip, and also illustrating a plurality of attachment features (e.g., dimples, piercings, protrusions, bumps, rivets, other mechanical features, etc.) which may help improve electrical conductivity and adhesion strength between the cover's perimeter flange and the poly-foil; and FIGS. 13 through 15 show a BLS including a frame or fence and a cover or lid according to another exemplary embodiment in which the cover includes poly-foil coupled to an upper or outer surface of the cover's inwardly extending perimeter flange, rim, or lip, and also illustrating a plurality of attachment features (e.g., dimples, piercings, protrusions, bumps, rivets, other mechanical features, etc.) which may help improve electrical conductivity and adhesion strength between the cover's perimeter flange and the poly-foil.

DETAILED DESCRIPTION

Example embodiments will now be described more fully with reference to the accompanying drawings.

Disclosed herein are exemplary embodiments of board level shields that include foil and/or film, such as metal foil, reinforced foil, poly-foil (e.g., metal foil laminated to polyester or polyethylene terephthalate (PET), polypropylene (PP), polyethylene (PE), other polymers, etc.), metallized or metal plated polyimide film, electrically-conductive plastic film, other electrically-conductive films, other foils, other electrically-conductive material layers, etc.

By way of example, foil or film may be coupled (e.g., attached or bonded with adhesive, soldered, laser welded, mechanically fastened, etc.) to a fence or frame of a board level shield (BLS). In which case, the BLS cover may consist of only the foil or film. Stated differently, the foil or film may define and be operable as the BLS cover after the foil or film is attached to and disposed over the open top of the BLS frame. In some exemplary embodiments, one or more dimples, piercings, protrusions, bumps, rivets, other mechanical features may be provided or formed in the foil or film and frame from either side of the attachment or joint between the foil or film and the frame, which may help improve electrical conductivity and adhesion strength between the mating materials of the foil or film and the frame.

Alternatively, the foil or film may be coupled (e.g., attached or bonded with adhesive, soldered, laser welded, mechanically fastened, etc.) to a BLS cover or lid. For example, the foil or film may be coupled to an upper surface of the cover's inwardly extending perimeter rim such that the foil or film is disposed over and covers an opening of the cover defined by the cover's inwardly extending perimeter rim. The cover may be configured to be removably attachable (e.g., via dimples and holes, other mechanisms, etc.) to the frame. In which case, the cover and foil or film attached thereto may be removed from the frame, for example, to permit inspection, repair, etc. of components under the BLS. In some exemplary embodiments (e.g., FIGS. 6 through 15, etc.), one or more dimples, piercings, protrusions, bumps, rivets, other mechanical features may be provided or formed in the foil or film and cover from either side of the attachment or joint between the foil or film and the cover, which may help improve electrical conductivity and adhesion strength between the mating materials of the foil or film and the cover.

Figure 2:
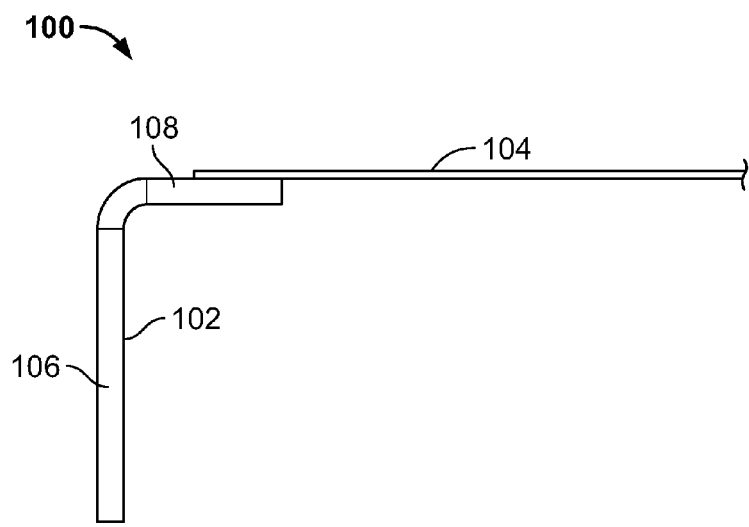
FIG. 2 is a cross-sectional side view of a portion of the BLS shown in FIG. 1 after the foil or film cover has been coupled (e.g., attached or bonded with adhesive, soldered, laser welded, mechanically fastened, etc.) to the frame along an upper or outer surface of the frame's inwardly extending perimeter flange, rim, or lip.
Figure 4:
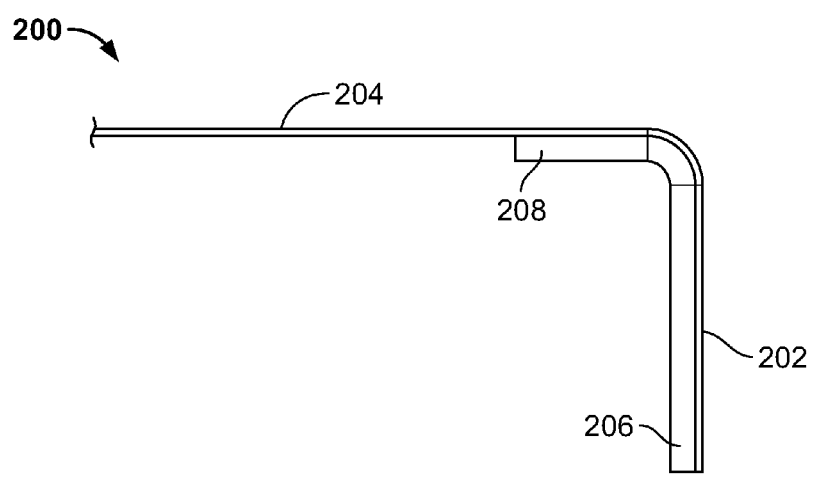
FIG. 4 is a cross-sectional side view of a portion of the BLS shown in FIG. 3 after the foil or film cover has been wrapped about the frame.

Advantageously, using foil or film as the BLS cover or as part of a BLS cover may reduce the weight of the BLS and/or increase the available Z-height or under-shield space thereby providing a customer more design space under the foil or film. As shown by FIGS. 2 and 4, covering a frame or fence with a foil or film allows the area defined between the frame's inwardly extending perimeter rim to remain open and free of material, thereby allowing taller components to be positioned underneath the foil or film of the BLS. Similarly, covering a cover with a foil or film attached to an upper surface of the cover's inwardly extending perimeter rim allows the area defined between the cover's inwardly extending perimeter rim to remain open and free of material, thereby allowing taller components to be positioned underneath the foil or film of the cover as shown in FIGS. 6, 8, 11, and 14.

Figure 1:
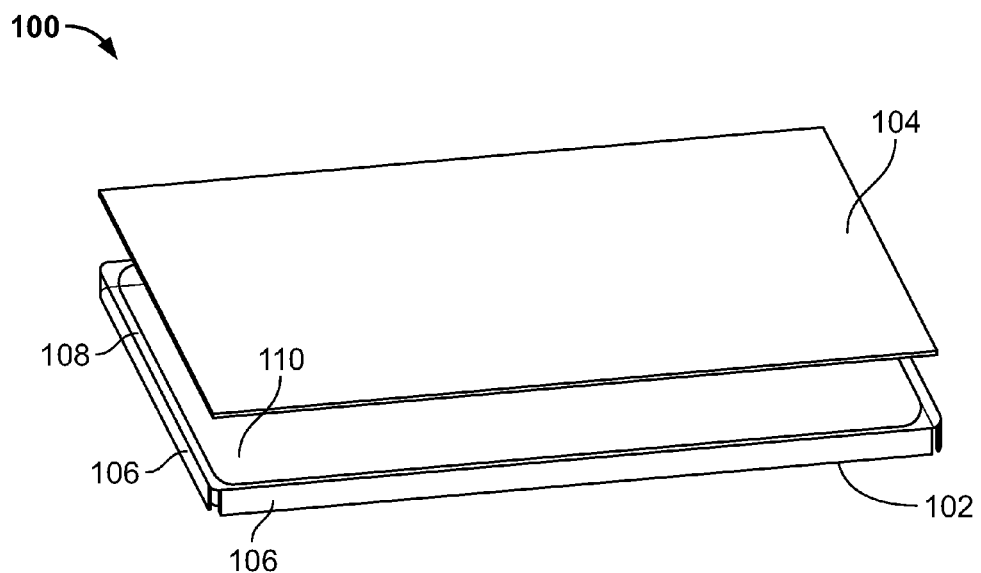
FIG. 1 is an exploded perspective view of a board level shield (BLS) including a frame or fence and a foil or film cover or lid (e.g., electrically-conductive plastic film, metallized or metal plated film, metal foil, reinforced foil, poly-foil, etc.) according to an exemplary embodiment.

With reference to the figures, FIGS. 1 and 2 illustrate an exemplary embodiment of a board level shield (BLS) 100 according to aspects of the present disclosure. The shield 100 includes a frame or fence 102 and a cover, lid, or top 104.

The cover 104 includes an electrically-conductive foil or film, such as metal plated polyimide film, other metallized or metal plated film, other electrically-conductive films, metal foil, reinforced foil, poly-foil (e.g., metal foil laminated to polyester or polyethylene terephthalate (PET), polypropylene (PP), polyethylene (PE), other polymer, etc.), other foils, etc. For example, the cover 104 may comprise Mylar® polyester film, other polyester film, polyimide (PI) film, polyethylene terephthalate (PET) film, polyethylene naphthalate (PEN) film, a high temperature polymer film, other films, other materials, etc. The film may include electrically-conductive material thereon, such as metal plating or electrically-conductive ink or paste (e.g., silver ink or paste, etc.) applied (e.g., plated, printed, etc.) onto either or both surfaces of the film. Other embodiments may include covers made of different foils, different films, and/or electrically-conductive materials.

The frame 102 comprises an electrically-conductive EMI shielding material, such as metal (e.g., cold rolled steel, sheet metal, aluminum, etc.), etc. The frame 102 includes sidewalls 106 that define an open top of the frame 102. The sidewalls 106 are configured for installation (e.g., soldering, etc.) to a printed circuit board (PCB) (broadly, a substrate) generally about one or more components on the PCB. In this example, the frame 102 includes a perimeter flange, rim, or lip 108 extending inwardly from the top of the sidewalls 106. The perimeter flange 108 defines an opening 110. Alternatively, the frame may be flangeless (without an inwardly extending flange). Accordingly, the BLS lids disclosed herein should not be limited to use with any one specific BLS frame, fence, or sidewalls.

The foil or film cover 104 is attachable to the frame 102 along the upper or outer surface of the frame's perimeter flange 108 such that the open top or opening 110 of the frame 102 is covered by the foil or film cover 104. By attaching the foil or film cover 104 along the outer surface of the perimeter flange 108 as shown in FIG. 2, the available space under the BLS 100 may be increased at the opening 110 by an amount equal to the material thickness of the flange 108 as compared to a single piece BLS without any opening 110.

In this exemplary embodiment, the foil or film cover 104 is attached to the frame's perimeter flange 108 without extending along the sidewalls 106. The foil or film cover 104 may be attached to the frame 102, e.g., bonded with adhesive, soldered, laser welded, mechanically fastened, etc. For example, electrically-conductive pressure sensitive adhesive (PSA) may be positioned between and along the upper surface of the perimeter flange 108 and the perimeter edge portions of the foil or film cover 104. Or, for example, the perimeter edge portions of the foil or film cover 104 may be soldered to the upper surface of the perimeter flange 108. Alternatively, the foil or film cover 104 may be attachable to the frame 102 via other means.

The bottom surfaces of the frame's sidewalls 106 may be configured to be soldered to corresponding solder pads on a PCB. Alternatively, electrically-conductive PSA may be along the bottom surfaces of the sidewalls 106 for attaching the frame 102 to a substrate, e.g., PCB, etc. By way of example only, the electrically-conductive PSA may be electrically-conductive PSA tape from Laird Technologies, such as LT-301 PSA tape having a thickness of about 0.09 millimeters, a peel strength on stainless steel of greater than 1.3 kilogram force per 25 millimeters, and Z-axis resistance of less than 0.05 ohms. Alternatively, the frame may be attachable to a substrate via other means.

The cover 104 comprises an EMI shielding surface in the form of a foil or film. In this illustrated example, the cover 104 consists only of the foil or film. Alternatively, the cover 104 may also include one or more other layers or portions, such that the cover 104 may also be referred to as a cover assembly. For example, the cover 104 may include a first or top electrically-conductive foil or film layer or portion, a second or middle electrically-conductive adhesive layer or portion, and a third or bottom dielectric layer or portion. The dielectric layer may provide electrical insulation to inhibit the cover 104 from electrically shorting any components received under the cover 104 within the interior cooperatively defined by the frame 102 and cover 104. In some embodiments, the cover 104 consists of only a single foil or film layer and does not include any additional adhesive or dielectric layers. In still other embodiments, foil or film may be coupled to a cover such that the foil or film is disposed over and covers an open top of the cover (e.g., cover 404 in FIG. 6, etc.).

Although FIG. 1 illustrates the frame 102 and cover 104 having rectangular shapes, other exemplary embodiments may include frames and covers having different configurations (e.g., circular, triangular, irregular, other non-rectangular shapes, etc.). In this illustrated embodiment, the BLS 100 is free of interior walls, dividers, or partitions such that the sidewalls 106 of the frame 102 generally define a single interior space or compartment. In other exemplary embodiments, a frame may include one or more interior walls, dividers, or partitions (e.g., extending between and/or attached to sidewalls of the frame, etc.) for sectioning the frame into two or more interior spaces.

The cover 104 may have a perimeter or footprint that is sized and shaped to match or correspond to a size and shape of the frame's perimeter or footprint. In this exemplary embodiment, the footprint or perimeter of the cover 104 is smaller than the footprint or perimeter of the frame 102 so that the cover 104 does not extend beyond or overhand any edges of the frame 102. The cover 104 is shaped and sized to cover the entire open top or opening 110 defined by the frame 102 such that the frame 102 and cover 104 cooperatively provide EMI shielding for components received within the interior cooperatively defined by the frame 102 and cover 104.

The frame's sidewalls 106 may be integrally formed, such that the sidewalls 106 have a single-piece or unitary construction. In which case, the frame 102 would not include any gaps between adjacent pairs of the sidewalls 106 that allow EMI leakage. The frame 102 also would not include any weld joints connecting separate sidewalls 106 to each other as the frame's sidewalls 106 are integrally connected to each other. Alternatively, the BLS 100 may include sidewalls comprised of multiple separate pieces instead of a single-piece frame.

The cover 104 may include one or more materials (e.g., polyimide (PI), other high temperature polymer, etc.) suitable for withstanding (e.g., without significant deformation or shrinkage, etc.) the reflow soldering process used to install the frame 102 to a PCB. This may eliminate the need for secondary installation as the frame 102 and cover 104 may be assembled together and then installed to the PCB as an assembled complete unit. For example, the cover 104 may first be attached to the frame 102 before the frame 102 is installed (e.g., soldered, etc.) to a PCB. Then, the frame 102 with the cover 104 attached thereto may be applied as a complete unit for reflow, thus eliminating the secondary post-installation step of attaching the cover 104 to the frame 102 after the frame 102 has been installed to the PCB. In exemplary embodiments, the cover 104 comprises a high temperature resistant film (e.g., dielectric polyethylene terephthalate (PET) film, dielectric polyimide (PIM) film, etc.) having electrically-conductive material (e.g., metal plating, electrically-conductive ink or paste, etc.) thereon, where the cover 104 is able to withstand solder reflow (e.g., withstand reflow temperatures of 250 degrees Celsius and a cycle time of nine minutes, etc.).

Although not shown in FIGS. 1 and 2, one or more attachment features (e.g., dimples, piercings, protrusions, bumps, rivets, other mechanical features, etc.) may be provided or formed in the foil or film 104 and frame 108 from either side of the attachment or joint between the foil or film 104 and the frame 108. This may help improve electrical conductivity and adhesion strength between the mating materials of the foil or film 104 and the frame 108.

Figure 3:
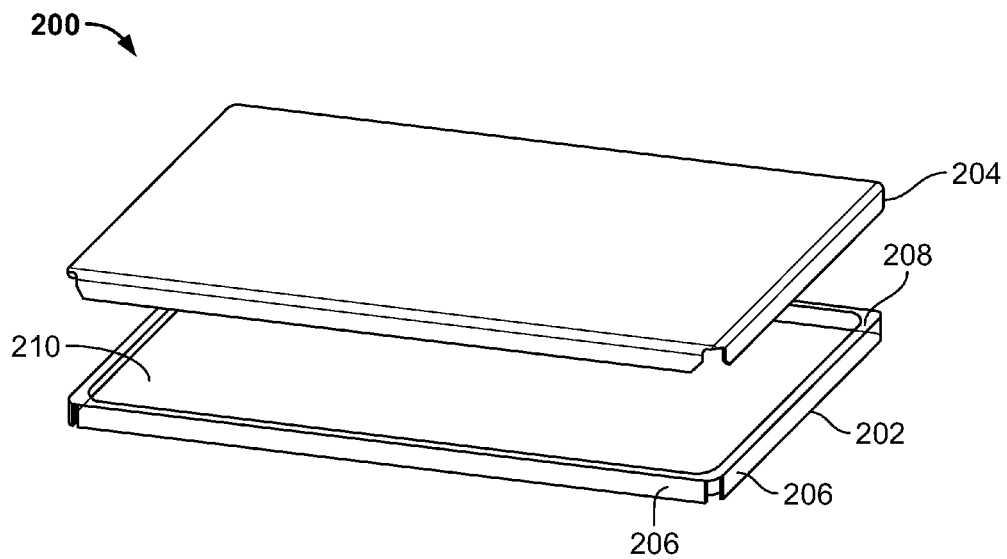
FIG. 3 is an exploded perspective view of a BLS including a frame or fence and a foil or film cover or lid according to another exemplary embodiment in which the cover is configured (e.g., sized and shaped, etc.) to be wrapped about the frame.

FIGS. 3 and 4 illustrate another exemplary embodiment of a BLS 200 embodying one or more aspects of the present disclosure. The BLS 200 includes a frame or fence 202 and a cover, lid, or top 204. The frame 202 may include similar or identical features to the corresponding features of the frame 102 the BLS 100. For example, the frame 202 includes sidewalls 206, an inwardly extending perimeter flange, rim, or lip 208, and open top or opening 210 that may be similar or identical to the sidewalls 106, perimeter flange 108, and opening 110 of the BLS 100.

The cover 204 includes an electrically-conductive foil or film, such as metal plated polyimide film, other metallized or metal plated film, other electrically-conductive films, metal foil, reinforced foil, poly-foil (e.g., metal foil laminated to polyester or polyethylene terephthalate (PET), polypropylene (PP), polyethylene (PE), other polymer, etc.), other foils, etc. For example, the cover 204 may comprise Mylar® polyester film, other polyester film, polyimide (PI) film, polyethylene terephthalate (PET) film, polyethylene naphthalate (PEN) film, a high temperature polymer film, other films, other materials, etc. The film may include electrically-conductive material thereon, such as metal plating or electrically-conductive ink or paste (e.g., silver ink or paste, etc.) applied (e.g., plated, printed, etc.) onto either or both surfaces of the film. Other embodiments may include covers made of different foils, films, and/or electrically-conductive materials.

The foil or film cover 204 is attachable to the frame 202 to cover the open top or opening 210 of the frame 202. In this exemplary embodiment, the foil or film cover 204 is configured (e.g., sized and shaped, etc.) to be wrapped about the frame 202. As shown in FIG. 4, the foil or film cover 204 is disposed along the outer surfaces of the frame's perimeter flange 208 and sidewalls 206. By positioning the foil or film cover 204 along the outer surfaces of the perimeter flange 208 as shown in FIG. 4, the available space under the BLS 200 may be increased at the opening 210 by an amount equal to the material thickness of the flange 208 as compared to a single piece BLS without any opening 210.

In exemplary embodiments, the foil or film cover 204 may not bonded to the frame 202, such that the foil or film cover 204 may be removed by unwrapping the foil or film cover 204 off the frame 202. In other exemplary embodiments, the foil or film cover 204 may be attached or bonded to the frame 202, e.g., adhesively bonded (e.g., electrically-conductive pressure sensitive adhesive (PSA), etc.), soldered, laser welded, mechanically fastened, etc.

The cover 204 comprises an EMI shielding surface in the form of a foil or film. In this illustrated example, the cover 204 consists only of the foil or film. Alternatively, the cover 204 may also include one or more other layers or portions, such that the cover 204 may also be referred to as a cover assembly. For example, the cover 204 may include a first or top electrically-conductive foil or film layer or portion, a second or middle electrically-conductive adhesive layer or portion, and a third or bottom dielectric layer or portion. The dielectric layer may provide electrical insulation to inhibit the cover 204 from electrically shorting any components received under the cover 204 within the interior cooperatively defined by the frame 202 and cover 204. In some embodiments, the cover 204 consists of only a single foil or film layer and does not include any additional adhesive or dielectric layers. In still other embodiments, foil or film may be coupled to a cover such that the foil or film is disposed over and covers an open top of the cover (e.g., cover 404 in FIG. 6, etc.).

Although FIG. 3 illustrates the frame 202 and cover 204 having rectangular shapes, other exemplary embodiments may include frames and covers having different configurations (e.g., circular, triangular, irregular, other non-rectangular shapes, etc.). In this illustrated embodiment, the BLS 200 is free of interior walls, dividers, or partitions such that the sidewalls 206 of the frame 202 generally define a single interior space or compartment. In other exemplary embodiments, a frame may include one or more interior walls, dividers, or partitions (e.g., extending between and/or attached to sidewalls of the frame, etc.) for sectioning the frame into two or more interior spaces.

The cover 204 may include one or more materials (e.g., polyimide (PI), other high temperature polymer, etc.) suitable for withstanding (e.g., without significant deformation or shrinkage, etc.) the reflow soldering process used to install the frame 202 to a PCB. This may eliminate the need for secondary installation as the frame 202 and cover 204 may be assembled together and then installed to the PCB as an assembled complete unit. For example, the cover 204 may first be attached to the frame 202 before the frame 202 is installed (e.g., soldered, etc.) to a PCB. Then, the frame 202 with the cover 204 attached thereto may be applied as a complete unit for reflow, thus eliminating the secondary post-installation step of attaching the cover 204 to the frame 202 after the frame 202 has been installed to the PCB. In exemplary embodiments, the cover 204 comprises a high temperature resistant film (e.g., dielectric polyethylene terephthalate (PET) film, dielectric polyimide (PIM) film, etc.) having electrically-conductive material (e.g., metal plating, electrically-conductive ink or paste, etc.) thereon, where the cover 204 is able to withstand solder reflow (e.g., withstand reflow temperatures of 250 degrees Celsius and a cycle time of nine minutes, etc.).

Although not shown in FIG. 3 or 4, one or more attachment features (e.g., dimples, piercings, protrusions, bumps, rivets, other mechanical features, etc.) may be provided or formed in the foil or film 204 and frame 208 from either side of the attachment or joint between the foil or film 204 and the frame 208. This may help improve electrical conductivity and adhesion strength between the mating materials of the foil or film 204 and the frame 208.

Figure 5:
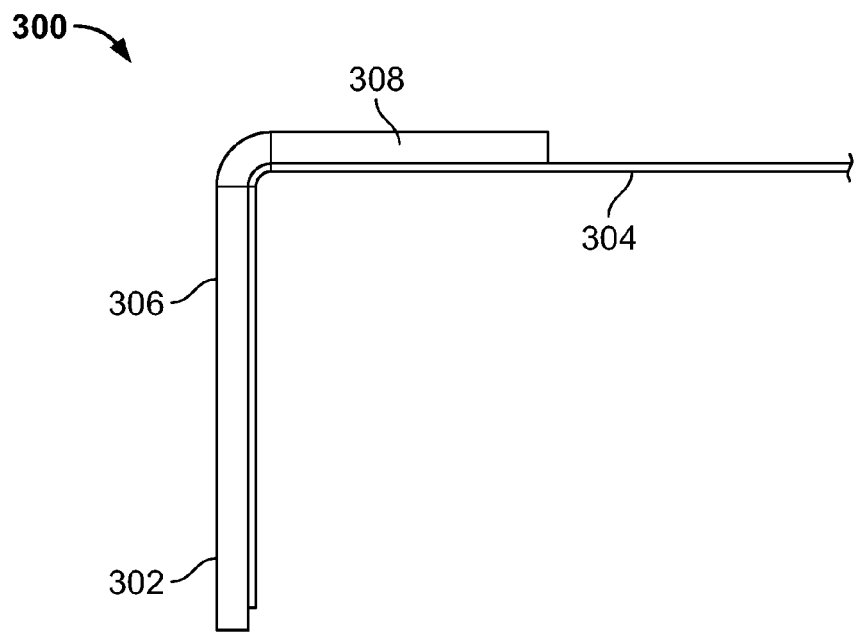
FIG. 5 is a cross-sectional side view of a portion of BLS including a frame or fence and a foil or film cover or lid according to another exemplary embodiment in which the cover has been coupled to the frame along an inner surface of the frame's sidewalls and inwardly extending perimeter flange, rim, or lip.

FIG. 5 illustrates another exemplary embodiment of a BLS 300 embodying one or more aspects of the present disclosure. The BLS 300 includes a frame or fence 302 and a cover, lid, or top 304. The frame 302 may include similar or identical features to the corresponding features of the frame 102 the BLS 100. For example, the frame 302 includes sidewalls 306, an inwardly extending perimeter flange, rim, or lip 308, and open top or opening that may be similar or identical to the sidewalls 106, perimeter flange 108, and opening 110 of the BLS 100.

The cover 304 includes an electrically-conductive foil or film, such as metal plated polyimide film, other metallized or metal plated film, other electrically-conductive films, metal foil, reinforced foil, poly-foil (e.g., metal foil laminated to polyester or polyethylene terephthalate (PET), polypropylene (PP), polyethylene (PE), other polymer, etc.), other foils, etc. For example, the cover 304 may comprise Mylar® polyester film, other polyester film, polyimide (PI) film, polyethylene terephthalate (PET) film, polyethylene naphthalate (PEN) film, a high temperature polymer film, other films, other materials, etc. The film may include electrically-conductive material thereon, such as metal plating or electrically-conductive ink or paste (e.g., silver ink or paste, etc.) applied (e.g., plated, printed, etc.) onto either or both surfaces of the film. Other embodiments may include covers made of different foils, different films, and/or electrically-conductive materials.

The foil or film cover 304 is attachable to the frame 302 to cover the open top or opening of the frame 302. In this exemplary embodiment, the foil or film cover 304 is disposed along the inner surfaces of the frame's perimeter flange 308 and sidewalls 306. Alternatively, the foil or film cover 304 may instead be disposed only along the inner surfaces of the frame's perimeter flange 308 without extending along the sidewalls 306.

The foil or film cover 304 may be attached to the frame 302, e.g., bonded with adhesive, soldered, laser welded, mechanically fastened, etc. For example, electrically-conductive pressure sensitive adhesive (PSA) may be positioned between and along the inner surfaces of the sidewalls 306 and perimeter flange 308 and the perimeter edge portions of the foil or film cover 304. Or, for example, the perimeter edge portions of the foil or film cover 304 may be soldered to the inner surfaces of the sidewalls 306 and perimeter flange 308. Alternatively, the foil or film cover 304 may be attachable to the frame 302 via other means.

The cover 304 comprises an EMI shielding surface in the form of a foil or film. In this illustrated example, the cover 304 consists only of the foil or film. Alternatively, the cover 304 may also include one or more other layers or portions, such that the cover 304 may also be referred to as a cover assembly. For example, the cover 304 may include a first or top electrically-conductive foil or film layer or portion, a second or middle electrically-conductive adhesive layer or portion, and a third or bottom dielectric layer or portion. The dielectric layer may provide electrical insulation to inhibit the cover 304 from electrically shorting any components received under the cover 304 within the interior cooperatively defined by the frame 302 and cover 304. In some embodiments, the cover 304 consists of only a single foil or film layer and does not include any additional adhesive or dielectric layers. In still other embodiments, foil or film may be coupled to a cover such that the foil or film is disposed over and covers an open top of the cover (e.g., cover 404 in FIG. 6, etc.).

Although FIG. 5 illustrates the frame 302 and cover 304 having rectangular shapes, other exemplary embodiments may include frames and covers having different configurations (e.g., circular, triangular, irregular, other non-rectangular shapes, etc.). In this illustrated embodiment, the BLS 300 is free of interior walls, dividers, or partitions such that the sidewalls 306 of the frame 302 generally define a single interior space or compartment. In other exemplary embodiments, a frame may include one or more interior walls, dividers, or partitions (e.g., extending between and/or attached to sidewalls of the frame, etc.) for sectioning the frame into two or more interior spaces.

The cover 304 may include one or more materials (e.g., polyimide (PI), other high temperature polymer, etc.) suitable for withstanding (e.g., without significant deformation or shrinkage, etc.) the reflow soldering process used to install the frame 302 to a PCB. This may eliminate the need for secondary installation as the frame 302 and cover 304 may be assembled together and then installed to the PCB as an assembled complete unit. For example, the cover 304 may first be attached to the frame 302 before the frame 302 is installed (e.g., soldered, etc.) to a PCB. Then, the frame 302 with the cover 304 attached thereto may be applied as a complete unit for reflow, thus eliminating the secondary post-installation step of attaching the cover 304 to the frame 302 after the frame 302 has been installed to the PCB. In exemplary embodiments, the cover 304 comprises a high temperature resistant film (e.g., dielectric polyethylene terephthalate (PET) film, dielectric polyimide (PIM) film, etc.) having electrically-conductive material (e.g., metal plating, electrically-conductive ink or paste, etc.) thereon, where the cover 304 is able to withstand solder reflow (e.g., withstand reflow temperatures of 250 degrees Celsius and a cycle time of nine minutes, etc.).

Although not shown in FIG. 5, one or more attachment features (e.g., dimples, piercings, protrusions, bumps, rivets, other mechanical features, etc.) may be provided or formed in the foil or film 304 and frame 308 from either side of the attachment or joint between the foil or film 304 and the frame 308. This may help improve electrical conductivity and adhesion strength between the mating materials of the foil or film 304 and the frame 308.

FIG. 6 illustrates a cover 403 for a board level shield according to another exemplary embodiment embodying one or more aspects of the present disclosure. The cover 403 may be used with a frame or fence as disclosed herein. For example, the cover 403 may be configured to be removably attachable (e.g., via dimples and holes, other mechanisms, etc.) to a BLS frame. In which case, the cover 403 may be removed from the frame, for example, to permit inspection, repair, etc. of components under the BLS.

As shown in FIG. 6, the cover 403 includes sidewalls 405 and an inwardly extending perimeter flange, rim, or lip 407. The cover may further include an open top or opening defined by or between the perimeter flange 407. A foil or film 404 is coupled to an upper surface of the cover's inwardly extending perimeter rim 407 such that the foil or film 404 is disposed over and covers the opening or open top of the cover 404.

The foil or film 404 may comprise various materials, such as metal plated polyimide film, other metallized or metal plated film, other electrically-conductive films, metal foil, reinforced foil, poly-foil, other foils, etc. For example, the foil or cover 404 may comprise metal foil laminated to polyester or polyethylene terephthalate (PET), polypropylene (PP), polyethylene (PE), other polymer, etc. Or, for example, the foil or film 404 may comprise Mylar® polyester film, other polyester film, polyimide (PI) film, polyethylene terephthalate (PET) film, polyethylene naphthalate (PEN) film, a high temperature polymer film, other films, other materials, etc. The film may include electrically-conductive material thereon, such as metal plating or electrically-conductive ink or paste (e.g., silver ink or paste, etc.) applied (e.g., plated, printed, etc.) onto either or both surfaces of the film. Other embodiments may include covers made of different foils, different films, and/or electrically-conductive materials.

The sidewalls 405 and perimeter flange 407 of the cover 404 may comprise an electrically-conductive EMI shielding material, such as metal (e.g., cold rolled steel, sheet metal, aluminum, etc.), etc. The cover's sidewalls 405 are configured for installation (e.g., removably attachment, etc.) to a frame or fence of a BLS. In this example, the cover 404 includes the perimeter flange, rim, or lip 407 extending inwardly from the top of the sidewalls 405. The perimeter flange 407 defines an opening that is covered by the foil or film 404. Alternatively, the cover may be flangeless (without an inwardly extending flange) in other embodiments.

In this exemplary embodiment, the foil or film 404 is attached to the cover's perimeter flange 407 without extending along the sidewalls 405. The foil or film 404 may be attached to the cover 403, e.g., bonded with adhesive, soldered, laser welded, mechanically fastened, etc. For example, electrically-conductive pressure sensitive adhesive (PSA) may be positioned between and along the upper surface of the cover's perimeter flange 407 and the perimeter edge portions of the foil or film 404. Or, for example, the perimeter edge portions of the foil or film 404 may be soldered to the upper surface of the cover's perimeter flange 407. Alternatively, the foil or film 404 may be attachable to the cover 403 via other means.

The foil or film 404 may have a perimeter or footprint that is sized and shaped to match or correspond to a size and shape of the cover's perimeter or footprint. In this exemplary embodiment, the footprint or perimeter of the foil or film 404 is smaller than the footprint or perimeter of the cover 403 so that the foil or film 404 does not extend beyond or overhand any edges of the cover 403. Alternatively, the foil or film 404 may be sized so as to extend beyond the edges of the cover 403 to allow the foil or film 404 to be disposed along and/or wrapped about the sidewalls 405 of the cover 403. The foil or film 404 is shaped and sized to cover the entire open top or opening defined by the cover 404 such that the foil or film 404, cover 403, and frame cooperatively provide EMI shielding for components received within the interior cooperatively defined by the foil or film 404, cover 403, and frame when the cover 403 is attached to the frame.

The foil or film 404 may include one or more materials (e.g., polyimide (PI), other high temperature polymer, etc.) suitable for withstanding (e.g., without significant deformation or shrinkage, etc.) the reflow soldering process used to install the frame to a PCB. This may eliminate the need for secondary installation as the frame, cover 403, and foil or film 404 may be assembled together and then installed to the PCB as an assembled complete unit. For example, the cover 403 (and foil film 404 attached thereto) may first be attached to the frame before the frame is installed (e.g., soldered, etc.) to a PCB. Then, the frame along with the cover 403 and foil or film 404 may be applied as a complete unit for reflow, thus eliminating the secondary post-installation step of attaching the cover 403 to the frame after the frame has been installed to the PCB. In exemplary embodiments, the foil or film 404 comprises a high temperature resistant film (e.g., dielectric polyethylene terephthalate (PET) film, dielectric polyimide (PIM) film, etc.) having electrically-conductive material (e.g., metal plating, electrically-conductive ink or paste, etc.) thereon, where the foil or film 404 is able to withstand solder reflow (e.g., withstand reflow temperatures of 250 degrees Celsius and a cycle time of nine minutes, etc.).

As shown in FIG. 6, a protrusion 420 (e.g., a dimple, bump, piercing, etc.) has been formed in the cover's perimeter flange 407 and the foil or film 404. In this example, the protrusion 420 extends or protrudes upwardly relative to the cover 403 and foil or film 404. Alternatively, the orientation of the protrusion 420 may be reversed such that the protrusion 420 extends or protrudes downwardly relative to the cover 403 and foil or film 404. The protrusion 420 may help improve electrical conductivity and adhesion strength between the mating materials of the cover's perimeter flange 407 (e.g., aluminum, etc.) and foil or film 404 (e.g., polyfoil, etc.).

FIGS. 7 through 9 show a BLS 500 including a frame or fence 502, a cover or lid 503, and foil or film 504 coupled to the cover 503 according to another exemplary embodiment embodying one or more aspects of the present disclosure. The frame 502 may include sidewalls 506 and an inwardly extending perimeter flange, rim, or lip 508. The frame 502 also includes an open top 510, which includes a plurality of openings defined by the perimeter flange 508 and cross braces or members 514. Alternatively, the frame may be flangeless (without an inwardly extending flange) and/or not include any cross braces in other embodiments.

The cover 503 may include sidewalls 505 (e.g., tabs, etc.) and an inwardly extending perimeter flange, rim, or lip 507. The cover 503 may also include an open top 516, which includes a plurality of openings defined by the perimeter flange 507 and cross braces or members 518. Alternatively, the cover may be flangeless (without an inwardly extending flange) and/or not include any cross braces in other embodiments.

The foil or film 504 may comprise various materials, such as metal plated polyimide film, other metallized or metal plated film, other electrically-conductive films, metal foil, reinforced foil, poly-foil, other foils, etc. For example, the foil or cover 504 may comprise metal foil laminated to polyester or polyethylene terephthalate (PET), polypropylene (PP), polyethylene (PE), other polymer, etc. Or, for example, the foil or film 504 may comprise Mylar® polyester film, other polyester film, polyimide (PI) film, polyethylene terephthalate (PET) film, polyethylene naphthalate (PEN) film, a high temperature polymer film, other films, other materials, etc. The film may include electrically-conductive material thereon, such as metal plating or electrically-conductive ink or paste (e.g., silver ink or paste, etc.) applied (e.g., plated, printed, etc.) onto either or both surfaces of the film. Other embodiments may include covers made of different foils, different films, and/or electrically-conductive materials.

The frame 502 and cover 503 may comprise an electrically-conductive EMI shielding material, such as metal (e.g., cold rolled steel, sheet metal, aluminum, etc.), etc. For example, the frame 502 and cover 504 may comprise aluminum with matte tin. The frame 502 and cover 503 may each have a single-piece or unitary construction. Alternatively, the frame 502 and/or cover 503 may include sidewalls comprised of multiple separate pieces instead of a single-piece. The cover's sidewalls 505 are configured for installation (e.g., removably attachment, etc.) to the frame 502. The frame's side walls 506 are configured for installation (e.g., soldering, etc.) to a printed circuit board (PCB) (broadly, a substrate) generally about one or more components on the PCB.

In this example, the foil or film 504 is coupled to an upper surface of the cover's inwardly extending perimeter rim 507 such that the foil or film 504 is disposed over and covers the open top 516 of the cover 504. In this exemplary embodiment, the foil or film 504 is attached to the cover's perimeter flange 507 without extending along the sidewalls 505. The foil or film 504 may be attached to the cover 503, e.g., bonded with adhesive, soldered, laser welded, mechanically fastened, etc. For example, electrically-conductive pressure sensitive adhesive (PSA) may be positioned between and along the upper surface of the cover's perimeter flange 507 and the perimeter edge portions of the foil or film 504. Or, for example, the perimeter edge portions of the foil or film 504 may be soldered to the upper surface of the cover's perimeter flange 507. Alternatively, the foil or film 504 may be attachable to the cover 503 via other means.

The foil or film 504 may have a perimeter or footprint that is sized and shaped to match or correspond to a size and shape of the cover's perimeter or footprint. In this exemplary embodiment, the footprint or perimeter of the foil or film 504 is smaller than the footprint or perimeter of the cover 503 so that the foil or film 504 does not extend beyond or overhand any edges of the cover 503. Alternatively, the foil or film 504 may be sized so as to extend beyond the edges of the cover 503 to allow the foil or film 504 to be disposed along and/or wrapped about the sidewalls 505 of the cover 503. The foil or film 504 is shaped and sized to cover the entire open top or opening defined by the cover 504 such that the foil or film 504, cover 503, and frame 502 cooperatively provide EMI shielding for components received within the interior cooperatively defined by the foil or film 504, cover 503, and frame 502 when the cover 503 is attached to the frame 502.

The foil or film 504 may include one or more materials (e.g., polyimide (PI), other high temperature polymer, etc.) suitable for withstanding (e.g., without significant deformation or shrinkage, etc.) the reflow soldering process used to install the frame to a PCB. This may eliminate the need for secondary installation as the frame 502, cover 503, and foil or film 504 may be assembled together and then installed to the PCB as an assembled complete unit. For example, the cover 503 (and foil film 504 attached thereto) may first be attached to the frame 502 before the frame 502 is installed (e.g., soldered, etc.) to a PCB. Then, the frame 502 along with the cover 503 and foil or film 504 may be applied as a complete unit for reflow, thus eliminating the secondary post-installation step of attaching the cover 503 to the frame 502 after the frame 502 has been installed to the PCB. In exemplary embodiments, the foil or film 504 comprises a high temperature resistant film (e.g., dielectric polyethylene terephthalate (PET) film, dielectric polyimide (PIM) film, etc.) having electrically-conductive material (e.g., metal plating, electrically-conductive ink or paste, etc.) thereon, where the foil or film 504 is able to withstand solder reflow (e.g., withstand reflow temperatures of 250 degrees Celsius and a cycle time of nine minutes, etc.).

As shown in FIGS. 7 through 9, protrusions 520 (e.g., a dimple, bump, piercing, etc.) have been formed in the cover's perimeter flange 507 and the foil or film 504. The protrusions 520 may extend or protrude upwardly relative to the cover 503 and foil or film 504 as shown in FIG. 7. Alternatively, the orientation of the protrusions 520 may be reversed such that the protrusions 520 extend or protrude downwardly relative to the cover 503 and foil or film 504. Or, some of the protrusions 520 may extend or protrude downwardly while the other protrusions 520 may extend or protrude upwardly relative to the cover 503 and foil or film 504. The protrusions 520 may help improve electrical conductivity and adhesion strength between the mating materials of the cover's perimeter flange 507 (e.g., aluminum, etc.) and foil or film 504 (e.g., poly-foil, etc.).

FIGS. 10 through 12 show a BLS 600 including a frame or fence 602, a cover or lid 603, and foil or film 604 coupled to the cover 603 according to another exemplary embodiment embodying one or more aspects of the present disclosure. The frame 602, cover 603, and foil or film 604 may include similar or identical features to the corresponding features of the frame 502, cover 503, and foil or film 504 of the BLS 500. For example, protrusions 620 (e.g., a dimple, bump, piercing, rivets, other mechanical features, etc.) have been formed in the cover's perimeter flange and the foil or film 604. The protrusions 620 may help improve electrical conductivity and adhesion strength between the mating materials of the cover's perimeter flange (e.g., aluminum, etc.) and foil or film 604 (e.g., poly-foil, etc.).

The foil or film 604 may comprise various materials, such as metal plated polyimide film, other metallized or metal plated film, other electrically-conductive films, metal foil, reinforced foil, poly-foil, other foils, etc. For example, the foil or cover 604 may comprise metal foil laminated to polyester or polyethylene terephthalate (PET), polypropylene (PP), polyethylene (PE), other polymer, etc. Or, for example, the foil or film 604 may comprise Mylar® polyester film, other polyester film, polyimide (PI) film, polyethylene terephthalate (PET) film, polyethylene naphthalate (PEN) film, a high temperature polymer film, other films, other materials, etc. The film may include electrically-conductive material thereon, such as metal plating or electrically-conductive ink or paste (e.g., silver ink or paste, etc.) applied (e.g., plated, printed, etc.) onto either or both surfaces of the film. Other embodiments may include covers made of different foils, different films, and/or electrically-conductive materials. In exemplary embodiments, the foil or film 604 comprises a high temperature resistant film (e.g., dielectric polyethylene terephthalate (PET) film, dielectric polyimide (PIM) film, etc.) having electrically-conductive material (e.g., metal plating, electrically-conductive ink or paste, etc.) thereon, where the foil or film 604 is able to withstand solder reflow (e.g., withstand reflow temperatures of 250 degrees Celsius and a cycle time of nine minutes, etc.).

FIGS. 13 through 15 show a BLS 700 including a frame or fence 702, a cover or lid 703, and foil or film 704 coupled to the cover 703 according to another exemplary embodiment embodying one or more aspects of the present disclosure. The frame 702, cover 703, and foil or film 704 may include similar or identical features to the corresponding features of the frame 502, cover 503, and foil or film 504 of the BLS 500. For example, protrusions 720 (e.g., a dimple, bump, piercing, rivets, other mechanical features, etc.) have been formed in the cover's perimeter flange and the foil or film 704. The protrusions 720 may help improve electrical conductivity and adhesion strength between the mating materials of the cover's perimeter flange (e.g., aluminum, etc.) and foil or film 704 (e.g., poly-foil, etc.).

The foil or film 704 may comprise various materials, such as metal plated polyimide film, other metallized or metal plated film, other electrically-conductive films, metal foil, reinforced foil, poly-foil, other foils, etc. For example, the foil or cover 704 may comprise metal foil laminated to polyester or polyethylene terephthalate (PET), polypropylene (PP), polyethylene (PE), other polymer, etc. Or, for example, the foil or film 704 may comprise Mylar® polyester film, other polyester film, polyimide (PI) film, polyethylene terephthalate (PET) film, polyethylene naphthalate (PEN) film, a high temperature polymer film, other films, other materials, etc. The film may include electrically-conductive material thereon, such as metal plating or electrically-conductive ink or paste (e.g., silver ink or paste, etc.) applied (e.g., plated, printed, etc.) onto either or both surfaces of the film. Other embodiments may include covers made of different foils, different films, and/or electrically-conductive materials. In exemplary embodiments, the foil or film 704 comprises a high temperature resistant film (e.g., dielectric polyethylene terephthalate (PET) film, dielectric polyimide (PIM) film, etc.) having electrically-conductive material (e.g., metal plating, electrically-conductive ink or paste, etc.) thereon, where the foil or film 704 is able to withstand solder reflow (e.g., withstand reflow temperatures of 250 degrees Celsius and a cycle time of nine minutes, etc.).

In exemplary embodiments, a dielectric or electrical insulator film and/or label may be added to the foil or film to provide electrical isolation, identification, and damage protection. The bonding (e.g., electrically-conductive adhesive, solder, laser weld, etc.) of the foil or film to the frame or cover may also provide electrical contact with a heat sink and/or a high separation force. The foil or film may provide a thin bond line when used with thermally-conductive materials or thermal interface materials.

Other exemplary embodiments include methods of making board level EMI shielding apparatus or assemblies and methods relating to providing shielding for one or more components on a substrate. In an exemplary embodiment, a method generally includes covering an open top or opening defined by one or more sidewalls (e.g., sidewalls of a cover, sidewalls of a frame, etc.) with a foil or film, such as metal plated polyimide film, other metallized or metal plated film, other electrically-conductive films, metal foil, reinforced foil, poly-foil, other foils, etc. The one or more sidewalls may be part of a frame and be configured for installation to a substrate (e.g., PCB, etc.) generally about one or more components on the substrate. In which case, the one or more sidewalls and the foil or film are operable for shielding the one or more components on the substrate when the one or more components are within an interior cooperatively defined by the one or more sidewalls and the foil or film. Or, the one or more sidewalls may be part of a cover that is configured for installation to a frame or fence of a BLS.

This exemplary method may include attaching the foil or film to the one or more sidewalls and/or to a perimeter flange, rim, or lip extending inwardly from the one or more upper sidewalls, such as by using an adhesive (e.g., electrically-conductive pressure sensitive adhesive, etc.) or by soldering, laser welding, mechanically fastening, etc.

The method may include attaching (e.g., soldering, etc.) the one or more sidewalls to a substrate while the foil or film is covering the open top or opening defined by the one or more sidewalls and such that one or more components are disposed within an interior cooperatively defined by the foil or film and the one or more sidewalls. The one or more sidewalls may comprise a single sidewall, may comprise a plurality of sidewalls that are separate or discrete from each other, or may comprise a plurality of sidewalls that are integral parts of a single-piece frame or single-piece cover, etc.

In some exemplary embodiments, at least a portion (e.g., a frame, foil or film cover, etc.) of the BLS may be thermally conductive to help establish or define at least a portion of a thermally-conductive heat path from a heat source (e.g., board-mounted heat generating electronic component of an electronic device, etc.) to a heat dissipating and/or heat removal structure, such as a heat sink, an exterior case or housing of an electronic device (e.g., cellular phone, smart phone, tablet, laptop, personal computer, etc.), heat spreader, heat pipe, etc. For example, a frame and/or foil or film cover may be electrically conductive and thermally conductive. In this example, one or more thermal interface materials (e.g., compliant or conformable thermal interface pad, putty, or gap filler, etc.) may be disposed along (e.g., adhesively attached via a PSA tape, etc.) an inner and/or outer surface of the frame and/or foil or film cover. For example, a thermal interface material may be disposed along an outer surface of the foil or film cover. The thermal interface material may be configured to make contact (e.g., direct physical contact, etc.) with a heat dissipating device or heat removal structure. Example thermal interface materials include thermal gap fillers, thermal phase change materials, thermally-conductive EMI absorbers or hybrid thermal/EMI absorbers, thermal greases, thermal pastes, thermal putties, dispensable thermal interface materials, thermal pads, etc.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A board level shield (BLS) suitable for use in providing electromagnetic interference (EMI) shielding for at least one component on a substrate, the BLS comprising:
   one or more sidewalls defining an opening and configured for installation to the substrate generally about the at least one component on the substrate;

a cover configured to be removably attachable to the one or more sidewalls such that the cover is removable from and reattachable to the one or more sidewalls, the cover configured to cover the opening defined by the one or more sidewalls when the cover is removably attached to the one or more sidewalls, the cover including an electrically-conductive foil or film;

whereby when the one or more sidewalls are installed to the substrate generally about the at least one component and the cover is covering the opening defined by the one or more sidewalls, the lid and the one or more sidewalls are operable for providing EMI shielding for the at least one component within an interior cooperatively defined by the one or more sidewalls and the cover.

2. The board level shield of claim 1, wherein the electrically-conductive foil or film of the cover comprises a polymer film having electrically-conductive material thereon.

3. The board level shield of claim 1, wherein the electrically-conductive foil or film of the cover comprises a poly-foil comprising a metal foil laminated to a polymer film.

4. The board level shield of claim 1, wherein the electrically-conductive foil or film is a first layer of the cover, and the cover further comprises an electrically-conductive second layer, and a third dielectric layer.

5. The board level shield of claim 1, wherein the electrically-conductive foil or film of the cover comprises a metallized or metal plated polyimide film.

6. The board level shield of claim 1, wherein the board level shield comprises a frame that includes the one or more sidewalls, and wherein
the cover is removably attachable to the frame via dimples and holes, the cover including one or more sidewalls defining an opening, and the electrically-conductive foil or film is disposed over and covers the opening of the cover and the opening of the frame when the cover is attached to the frame.

7. The board level shield of claim 1, wherein:
the cover includes a perimeter flange; and
one or more protrusions are formed in the perimeter flange and in the electrically-conductive foil or film that are configured to help improve electrical conductivity and/or adhesion strength between the perimeter flange and the electrically-conductive foil or film.

8. A board level shield (BLS) suitable for use in providing electromagnetic interference (EMI) shielding for at least one component on a substrate, the BLS comprising:
one or more sidewalls defining an opening and configured for installation to the substrate generally about the at least one component on the substrate;
a cover configured to cover the opening defined by the one or more sidewalls, the cover including an electrically-conductive foil or film; and
a perimeter flange extending inwardly relative to the one or more sidewalls; wherein:
one or more protrusions are formed in the perimeter flange and the electrically-conductive foil or film that are configured to help improve electrical conductivity and/or adhesion strength between the perimeter flange and the electrically-conductive foil or film; and/or
the electrically-conductive foil or film is disposed along and attached to an inner surface of the perimeter flange.

9. The board level shield of claim 8, wherein the electrically-conductive foil or film of the cover is adhesively bonded, soldered, laser welded, or mechanically fastened to the inner or outer surface of the perimeter flange.

10. The board level shield of claim 8, wherein the cover includes the one or more sidewalls and the perimeter flange extending inwardly from the one or more sidewalls.

11. The board level shield of claim 8, wherein:
the board level shield comprises a frame that includes the one or more sidewalls; and
the cover is configured to be removably attachable to the frame such that the cover is removable from and reattachable to the frame.

12. The board level shield of claim 8, wherein:
the board level shield comprises a frame that includes the one or more sidewalls; and
the cover includes the perimeter flange.

13. A method comprising covering an open top defined by one or more sidewalls of a board level shield with an electrically-conductive film or foil;
wherein the electrically-conductive film or foil is attached to a cover that is removably attachable to a frame; and/or
wherein a perimeter flange extends inwardly relative to the one or more sidewalls, and:
one or more protrusions are in the electrically-conductive foil or film and the perimeter flange that are configured to help improve electrical conductivity and/or adhesion strength between the perimeter flange and the electrically-conductive foil or film; and/or
the electrically-conductive foil or film is disposed along and attached to an inner surface of the perimeter flange.

14. The method of claim 13, further comprising forming the one or more protrusions in the electrically-conductive foil or film and in the perimeter flange, which are configured to help improve electrical conductivity and/or adhesion strength between the electrically-conductive foil or film and the perimeter flange.

15. The method of claim 13, wherein the electrically-conductive foil or film comprises a poly-foil or a metallized or metal plated polyimide film.

16. The method of claim 13, further comprising attaching the one or more sidewalls to a substrate generally about one or more components on the substrate such that the one or more components are disposed within an interior cooperatively defined by the one or more sidewalls and the electrically-conductive foil or film, whereby the one or more sidewalls and the electrically-conductive film or foil are operable for shielding the one or more components on the substrate that are within the interior cooperatively defined by the one or more sidewalls and the electrically-conductive film or foil.

17. The method of claim 13, wherein the board level shield comprises a cover that includes the one or more sidewalls such that the method includes covering an open top defined by the one or more sidewalls of the cover with the electrically-conductive film or foil.

18. The method of claim 13, wherein:
the board level shield comprises a frame or a cover that includes the one or more sidewalls and a perimeter flange extending inwardly from the one or more sidewalls; and
the method comprises positioning the electrically-conductive foil or film along an outer or inner surface of the perimeter flange.

19. The method of claim 18, wherein:
the method comprises positioning the electrically-conductive foil or film along the inner surface of the perimeter flange.

20. The method of claim 13, wherein covering an open top defined by one or more sidewalls a board level shield with an electrically-conductive film or foil comprises removably attaching a cover that includes the electrically-conductive film or foil to a frame that includes the one or more sidewalls defining the open top.

* * * * *